United States Patent
Camagna et al.

[11] Patent Number: 6,134,570
[45] Date of Patent: Oct. 17, 2000

[54] METHOD AND APPARATUS FOR EFFICIENT IMPLEMENTATION OF A MULTIRATE LMS FILTER

[75] Inventors: John R. Camagna, El Dorado Hills; Hiroshi Takatori; Ping An, both of Sacramento, all of Calif.

[73] Assignee: Level One Communications, Inc., Sacramento, Calif.

[21] Appl. No.: 09/075,641

[22] Filed: May 11, 1998

Related U.S. Application Data

[60] Provisional application No. 60/046,255, May 12, 1997.

[51] Int. Cl.$^7$ ........................................... G06F 17/10
[52] U.S. Cl. ............................................. 708/313; 708/315
[58] Field of Search ..................................... 708/313, 315

[56] References Cited

U.S. PATENT DOCUMENTS

| | | | |
|---|---|---|---|
| 5,218,639 | 6/1993 | Osterweil | 380/34 |
| 5,272,656 | 12/1993 | Genereux | 708/319 |
| 5,732,002 | 3/1998 | Lee et al. | 708/313 |
| 5,892,694 | 4/1999 | Ott | 708/313 |
| 5,935,199 | 8/1999 | Del Signore | 708/313 |

OTHER PUBLICATIONS

Spring, A. et al., "Identifikationsverfahren Fuer Multrirate-–Systeme", Frequenz, vol. 45, No. 7/08, 07/01/91 pp. 164–169.

Copy of International Search Report from corresponding PCT application No. PCT/US98/09667.

*Primary Examiner*—David H. Malzahn
*Attorney, Agent, or Firm*—Merchant & Gould P.C.

[57] ABSTRACT

An efficient implementation of a multirate filter with delayed error feedback prevents an instruction processing rate requirement from increasing by performing interpolation and decimation in a LMS filter element at the same time. The multirate filter calculates an ith coefficient value, wherein i is a set of consecutive integers, by obtaining an (i−1)th error value, obtaining an (i−1)th data value, multiplying the (i−1)th error value and the (i−1)th data value to obtain an ith coefficient product, obtaining Mth coefficient value from a coefficient register, wherein M is a predetermined integer, adding the Mth coefficient value to the ith coefficient product to obtain an ith coefficient value calculating an ith data value by multiplying the (i−1)th data value and the Mth coefficient value to produce ith convolution product, and adding an (i−1)th convolution sum to the ith convolution product to produce an ith convolution sum. Obtaining of the Mth coefficient value decimates the convolution product by M and interpolates the error value by M. Obtaining of the (i−1)th data value further includes incrementing a data register by one when new data is not written into the data register.

20 Claims, 5 Drawing Sheets

ND APPARATUS FOR
METHOD AND APPARATUS FOR EFFICIENT IMPLEMENTATION OF A MULTIRATE LMS FILTER

RELATED APPLICATIONS

This application claims the benefit of Provisional Application, U.S. Ser. No. 60/046,255 filed on May 12, 1997.

BACKGROUND OF THE INVENTION

1. Field of the Invention

This invention relates in general to a signal processing, and more particularly to method and apparatus for efficient implementation of a multirate LMS filter.

2. Description of Related Art

Rapid changes in the way businesses and government communicate present opportunities for companies involved in broadband network technologies. For example, businesses are driven by a need to add new services constantly. In addition, the convergence of telephone and computer products has demonstrated the need for broadband solutions to support video conferencing, streamed video, telemedicine, and distance learning to name a few.

Digital subscriber line, DSL, technology was first introduced in 1989 as a way to send video and television signals from the telco central office to end-users over standard copper cable. At that time, video-on-demand was perceived as the broadband application that would drive digital subscriber line implementation. The first type of DSL technology was asymmetric digital subscriber line, ADSL, service. As its name suggest, ADSL is asymmetric, i.e., the line has different speeds away from and toward the customer. The focus of DSL has broadened to include applications such as Internet access and work-at-home. Consequently, multiple "flavors" of DSL technology have been proposed.

One proposal is high-bit-rate digital subscriber lines, HDSL. First generation HDSL systems have been in service for a few years. HDSL deployment is substantial in many regions of the world, largely for provisionning of T1 and E1 services to customers, and for digital connection of cellular and PCS base stations to the public telephone network. In North America, HDSL has been used mainly to provide T1 bit rate (1.54 MBPS), full duplex communications between customers' premises and telephone company central office using the regular subscriber loop plant. With HDSL, two pairs of lines are used, each carrying half the payload full duplex, in an arrangement known as dual duplex.

A recent proposal for a high rate digital subscriber loop (HDSL2) included different rates for transmit and receive sampling. This introduces a challenge for efficient echo cancellation. Prior solutions have either assumed symmetric baud rates that are integer multiples of one another (N is transmission rate, M is receive rate, either M/N or N/M is an integer).

In the case of HDSL2 the proposed rates are not integer multiples of one another. Possible solutions involve either a rate change engine at the input to the echo-canceller or interpolating up to a common multiple. Neither one of these solutions is very efficient.

To overcome these limitations, prior art LMS filters first interpolate up to a common multiple of the baud rates, adapt the LMS filter and then decimate the output. The error is then interpolated before being fed back to the LMS. If the baud rates are asymmetric baud rates, e.g., transmitting at 2 MHz and the receiving sample rate is 3 MHz, the signals can be interpolated to a common multiple frequency. Thus, the common multiple frequency rate would be 6 MHz. Then the LMS filter is clocked at that speed, the output is decimated and the errors are cancelled. However, the interpolation and decimation stages dramatically increase the instruction processing rate requirement on the filter since the instruction processing rate, measured in millions of instructions per second (MIPS), increases according to the product of the transmission rate and the receive rate, i.e., N*M.

There are two factors to cause the instruction processing rate to increase. First, in order to cover the appropriate amount of time, twice as many taps are required. However, to span that same time, these taps must be processed in half the time. Accordingly, the instruction processing rate goes up by a factor of four. Thus, in the example where the transmit rate is 2 MHz, and the receive rate is 3 MHz, the instruction processing rate requirement goes up by a factor of four to 24 MIPS.

It can be seen then that there is a need for an efficient LMS filter implementation that prevents the instruction processing rate requirement from increasing.

It can also be seen that there is a need for an efficient LMS filter implementation wherein the interpolation and decimation are performed in the LMS filter element at the same time so the instruction processing rate requirement stays very low.

SUMMARY OF THE INVENTION

To overcome the limitations in the prior art described above, and to overcome other limitations that will become apparent upon reading and understanding the present specification, the present invention discloses an efficient implementation of a multirate LMS filter with delayed error feedback.

The present invention solves the above-described problems by providing an efficient LMS filter implementation that prevents the instruction processing rate requirement from increasing by performing the interpolation and decimation in the LMS filter element at the same time so the instruction processing rate requirement stays very low.

A method in accordance with the principles of the present invention includes calculating an ith coefficient value, wherein i is a set of consecutive integers, by obtaining an (i−1)th error value, obtaining an (i−1)th data value, multiplying the (i−1)th error value and the (i−1)th data value to obtain an ith coefficient product, obtaining Mth coefficient value from a coefficient register, wherein M is a predetermined integer, and adding the Mth coefficient value to the ith coefficient product to obtain an ith coefficient value; and calculating an ith data value by multiplying an (i−1)th data value and the Mth coefficient value to produce ith convolution product and adding an (i−1)th convolution sum to the ith convolution product to produce on ith convolution sum.

Other embodiments of a system in accordance with the principles of the invention may include alternative or optional additional aspects. One such aspect of the present invention is that obtaining the Mth coefficient value decimates the convolution product by M and interpolates the error value by M.

Another aspect of the present invention is that obtaining the (i−1)th data value further comprises incrementing a data register by one when new data is not written into the data register.

Another aspect of the present invention is that obtaining the (i−1)th data value further comprises incrementing a data register by two when new data is written into the data register.

Another aspect of the present invention is that the incrementing of the data register by two is performed once in a convolution period.

Another aspect of the present invention is that the (i−1)th convolution sum is set to zero at the end of the convolution period.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the exemplary embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The present invention provides an efficient LMS filter implementation wherein the interpolation and decimation are performed in the LMS filter element at the same time so the instruction processing rate requirement stays very low.

Figure 1:
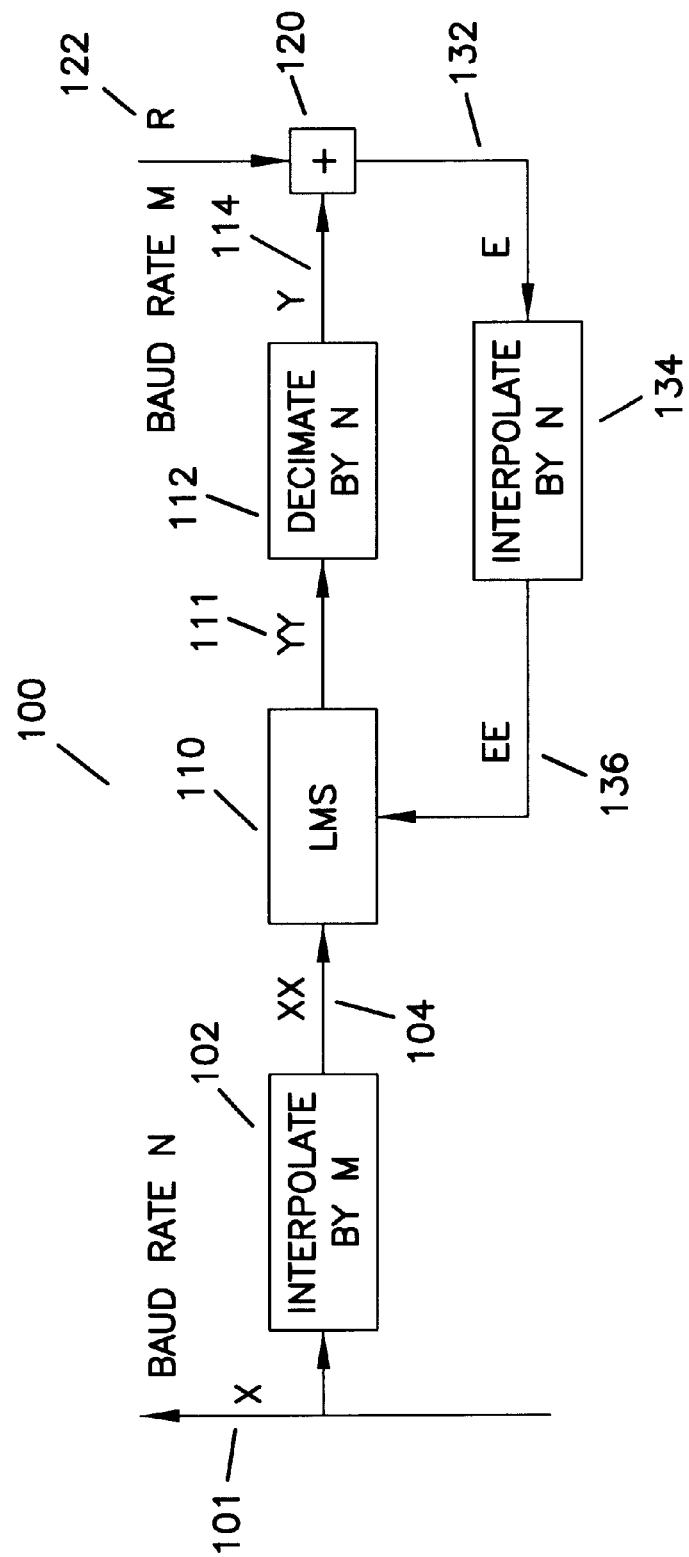
FIG. 1 illustrates a block diagram of a multirate LMS filter system according to the present invention.

FIG. 1 illustrates a block diagram of a multirate LMS filter system 100. In FIG. 1, the LMS filter system 100 interpolates up to a common multiple of the baud rates. The transmit baud rate N 101 is interpolated by M 102. This interpolated signal 104 is then filtered by the LMS filter 110. The filtered signal 111 is decimated by N 112 and added 120 to the received signal 122. This output is the error signal 132 which is interpolated by N 134 and fed back for error cancellation 136 to the LMS filter 110.

Accordingly, the LMS filter 110 goes through an adaptation process and the output 111 is then decimated 112. The error signal 132 is interpolated 134 before being fed back to the LMS filter 110 for error cancellation. Nevertheless, the multirate LMS filter system 100 of FIG. 1 includes individual interpolation 102, 134 and decimation 112 stages, which dramatically increase the instruction processing rate requirement on the filter system 100 as described above.

Figure 2A:
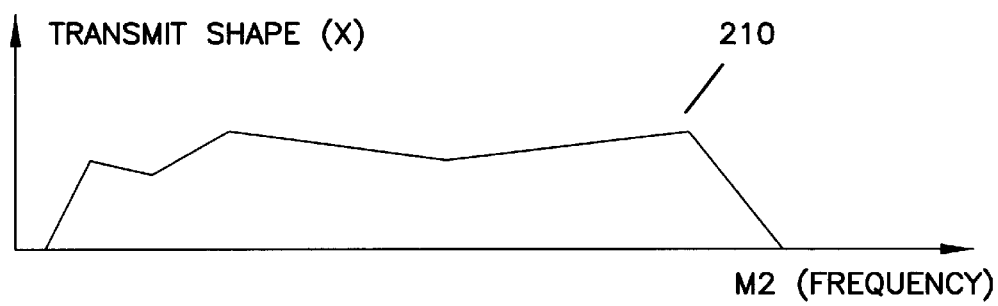
FIGS. 2a–2e illustrate the process performed by the multirate LMS filter system described with reference to FIG. 1.
Figure 2B:
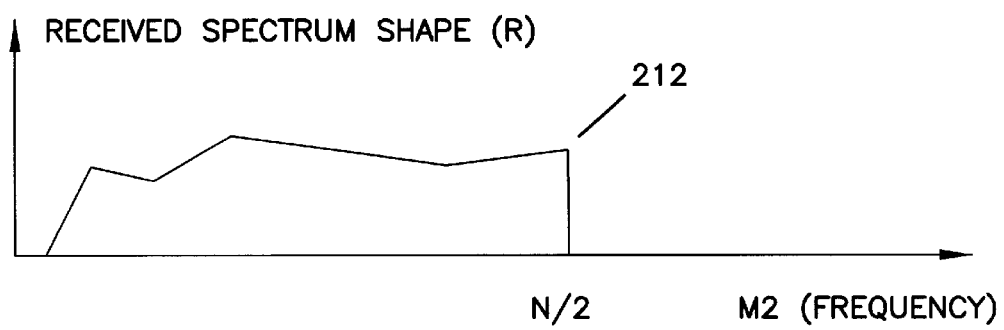
Figure 2C:
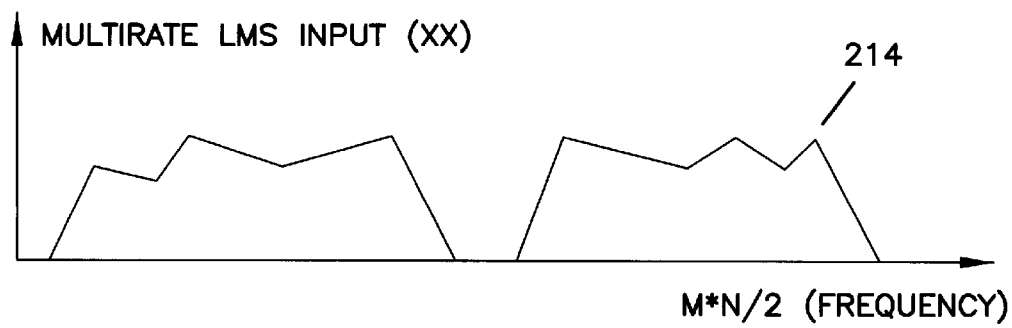
Figure 2D:
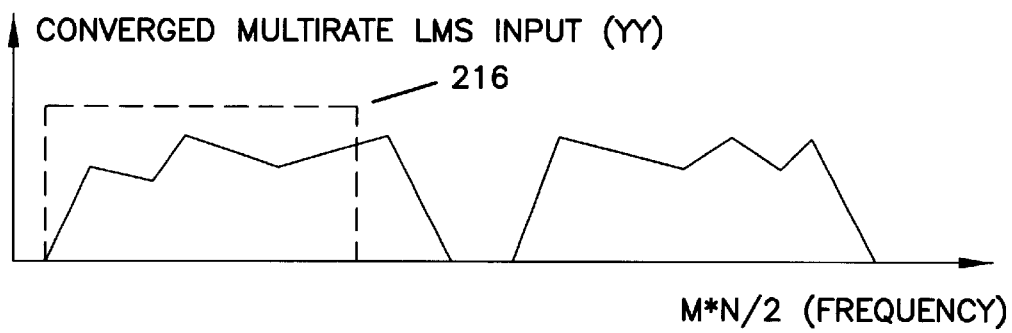
Figure 2E:
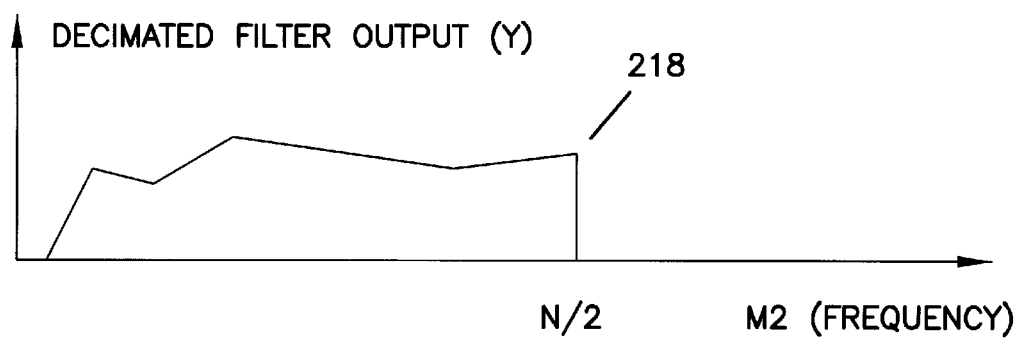

FIGS. 2a–2e illustrate the process performed by the multirate LMS filter system described with reference to FIG. 1. FIG. 2a illustrates a graphical representation for the shape of the transmit signal 210 prior to being interpolated. FIG. 2b illustrates the received spectrum shape 212. FIG. 2c illustrates the interpolated signal 214 at the output of the interpolate by M block. FIG. 2d illustrates the filtering of the signal by the LMS filter 216. Thus, the LMS filter provides a converged multirate LMS input to the decimate by N block. Finally, FIG. 2e illustrates the decimated filter output 218 prior to being combined with the received spectrum.

The actual convolution equations is as follows:
If i=0, M, 2M, . . . ; then $$XX_i = \frac{X_i}{M};$$

else $XX_i=0$.
The convolution output is as follows:
$YY_i = C_{mod_M}(i)^{XX}i + C_{mod_M}(i) + M^{XX}i + 1^+ \cdots$.
After decimation, the convolution is:
$Y_i = C_{mod_M}(Ni)^{XX}rem_M(Ni) + {}^CM + mod_M(Ni)^{XX}rem_M(Ni) + 1^{+etc}$.

The error interpolation is shown below:
If i=0,M,2M, . . . ; then $$EEi = \frac{E_i}{M};$$

else $EE_i=0$.
As a result, the Coefficient update equation becomes:
If j=0,M2M, . . . ; then $C_j = C_j + uEE_i XX_{rem_M}(Ni)$; else $C_j = C_j$.

To provide an efficient implementation of the above equations, only the necessary values need to be calculated. An example with M=3 and N=2 is shown below:

$$Y_0 = C_0 X_0 + C_3 X_1 + \ldots$$

$$(C_0 = C_0 + uE_0 X_0), (C_3 = C_3 + uE_0 X_1), \ldots$$

$$Y_1 = C_2 X_0 + C_5 X_1 + \ldots$$

$$(C_2 = C_2 + uE_1 X_0), (C_5 = C_5 + uE_1 X_1), \ldots$$

$$Y_2 = C_1 X_1 + C_4 X_2 + \ldots$$

$$(C_1 = C_1 + uE_2 X_1), (C_4 = C_4 + uE_2 X_2), \ldots$$

$$Y_3 = C_0 X_2 + C_3 X_3 + \ldots$$

$$(C_0 = C_0 + uE_3 X_2), (C_3 = C_3 + uE_3 X_3), \ldots$$

$$Y_4 = C_2 X_2 + C_5 X_3 + \ldots$$

$$(C_2 = C_2 + uE_4 X_2), (C_5 = C_5 + uE_4 X_3), \ldots$$

The key to an efficient implementation of a multirate LMS filter system is to combine the decimation and interpolation into the LMS filter. The underlying basis for an efficient implementation can be developed based upon concepts derived form the preceding mathematical discussion.

Figure 3:
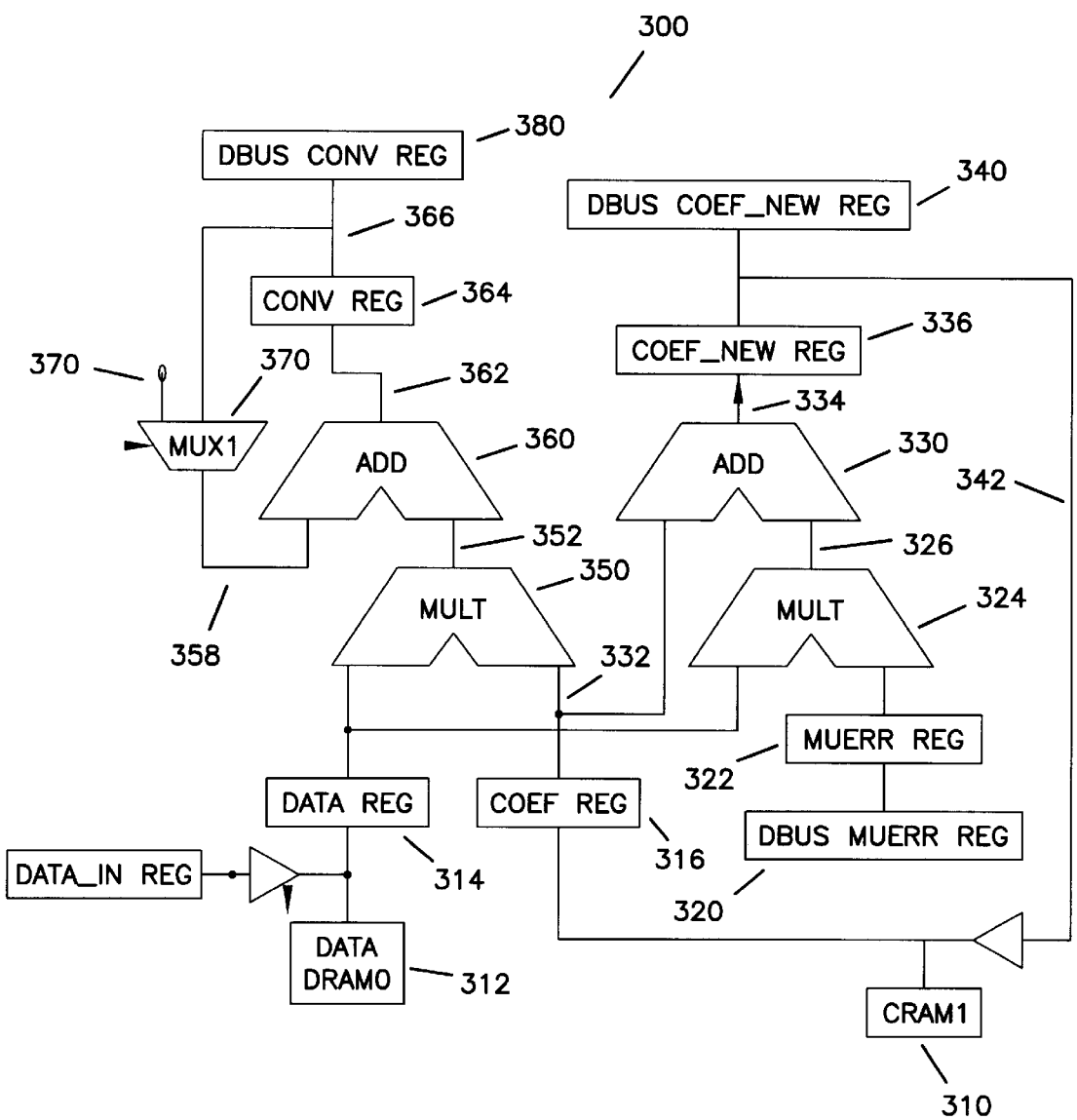
FIG. 3 illustrates a block diagram showing the LMS data path according to the present invention.

FIG. 3 illustrates a block diagram showing the LMS data path 300. In FIG. 3, the coefficients are fetched from the coefficient RAM 310. The data is also fetched from the data RAM 312. The data is loaded into data register 314 and the coefficients are loaded into coefficient register 316. The error is retrieved from the DBUS error register 320 and stored in the error register 322. Then, the data is multiplied by the error by a first multiplier 324 to generate a first product 326. The first product 326 is added via adder 330 to the old coefficient 332 to generate a new coefficient 334. The new coefficient is loaded into the new coefficient register 336 and then the data bus coefficient register 340. Then, this is written back 342 and stored to overwrite the old coefficient in the coefficient RAM 310.

At a second multiplier 350, the data is multiplied by the coefficient to generate a second product 352. The second product 352 is added with the convolution 358 via adder 360 to form a new convolution 362. This is stored in the convolution register 364. The new convolution 366 from the convolution register 364 is input to a multiplexer 370. Thus, the convolution 366 from the convolution register 364 is added to the second product 352 or the convolution is cleared 370 rather than accumulated. The new convolution 366 is loaded into the data bus convolution register 380.

Figure 4:
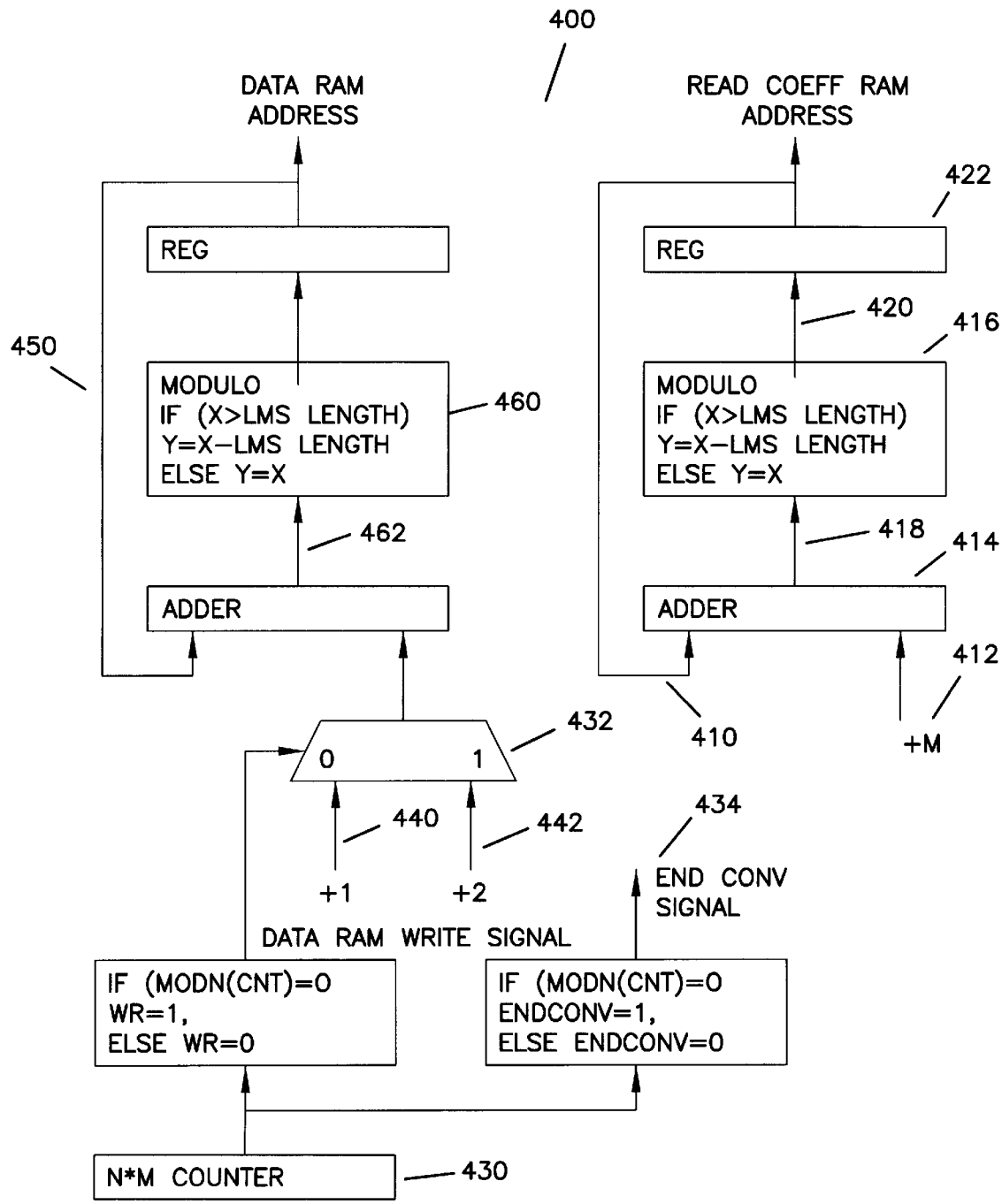
FIG. 4 illustrates the LMS address generation block diagram according to the present invention.

FIG. 4 illustrates the LMS address generation block diagram 400. The LMS address generation block diagram 400 illustrates the sequencing of the coefficients and the data. Typical of conventional sequencing, the coefficients are fetched in sequence, i.e., coefficient zero is fetched, then coefficient one, then coefficient two, etc.

In FIG. 4, LMS address generation according to the present invention is shown. In FIG. 4, coefficients are skipped, i.e., coefficient zero is fetched, then coefficient three, then coefficient five. This reduces the necessary hardware. The data RAM is also in this same order.

With regard to the coefficients, the coefficient is fetched 410 and is stepped by M 412 rather than by 1 at adder 414. This effectively decimates the convolution by M and interpolates the error by M as well. The modulo function 416 checks the result 418 to determine if the result is greater than the RAM link since this is a circular buffer. The modulo function 416 simply folds the result back in. The output 420 of the modulo function 416 is loaded into coefficient register 422.

With regard to the data, the N*M counter 430 is used to control the multiplexer 432 and the end of convolution signal 434, as described above with reference to FIG. 3. The data is stepped by 1 440 or by 2 442. Most of the time, the data is stepped by 1 440. However, once in a convolution period, new data is written into the data RAM and the address is stepped by 2 442. New data is written into the delay line only once a symbol. Again, since this is a circular buffer 450, the modulo function 460 checks the result 462 to determine if the result is greater than the RAM link. The modulo function 460 simply folds the result 462 back in.

In summary, by combining adaptive filtering with multirate filtering, the architecture may be simplified, i.e., the hardware required is reduced. In other words, the simultaneous implementation of the multi-rate filter in the LMS filter prevents the instruction processing rate requirement from increasing.

The input interpolation filter is combined with the LMS filter by modifying the LMS filter to store only the non-zero inputs to the delay line. Only the convolutions that will be left over after the output is decimated are calculated. In the case where M=3 and N=2, the instruction processing rate is reduced by a factor of 5, i.e., M*N-1.

The primary advantage of this architecture is that it dramatically reduces the needed hardware and processing speed from that of other implementations. The decimation by N is accomplished by pulling the decimation process into the LMS filter wherein only the convolutions that are needed are calculated. Thus, the convolutions that will not be used are dropped. The interpolation is wrapped into the delay line of the LMS filter by inserting zeros in the signal. The signal is then run through a low pass filter. Because the error is interpolated properly, then the high frequency energy may pass through the LMS since the high frequency energy is not going to effect the adaptation.

When the signal is interpolated by inserting zeros between every sample, the data rate doubles, but the image in the frequency domain is obtained. Thus, this signal is then run through a low pass filter to remove the image.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A method for performing multirate filtering, comprising:
   a. calculating a second coefficient value comprising:
      i) obtaining an error value;
      ii) obtaining a data value from a data register;
      iii) multiplying the data value and the error value to obtain a coefficient product;
      iv) adding a first coefficient value from a coefficient register; and
      v) adding the first coefficient value to the coefficient product to produce the second coefficient value; and
   b. calculating a second convolution value during a convolution period comprising:
      i) multiplying the data value and the first coefficient value to produce a convolution product;
      ii) adding a convolution input to the convolution product to produce the second convolution value;
   repeating steps a and b wherein the data value is obtained by incrementing the data register by one to produce a second data value as the data value, and the first coefficient value is obtained by incrementing the coefficient register by M to produce an Mth coefficient value as the first coefficient value.

2. The method of claim 1, wherein obtaining of the Mth coefficient value decimates the convolution product by M and interpolates the error value by M.

3. The method of claim 1, wherein obtaining of the data value further comprises incrementing of the data register by one when the second data value is not written into the data register.

4. The method of claim 1, wherein obtaining of the data value further comprises incrementing of the data register by two when the second data value is written into the data register.

5. The method of claim 4, wherein incrementing of the data register by two is performed once in the convolution period.

6. The method of claim 1, wherein a convolution input is set to zero when the convolution period ends.

7. A method for performing multirate filtering, comprising:
   calculating an ith coefficient value, wherein i is a set of consecutive integers, by obtaining an (i−1)th error value, obtaining an (i−1)th data value, multiplying the (i−1)th error value and the (i−1)th data value to obtain an ith coefficient product, obtaining Mth coefficient value from a coefficient register, wherein M is a predetermined integer, and adding the Mth coefficient value to the ith coefficient product to obtain an ith coefficient value; and
   calculating an ith data value by multiplying the (i−1)th data value and the Mth coefficient value to produce an ith convolution product, and adding an (i−1)th convolution sum to the ith convolution product to produce an ith convolution sum.

8. The method of claim 7, wherein obtaining of the Mth coefficient value decimates the ith convolution product by M and interpolates the (i−1)th error value by M.

9. The method of claim 7, wherein obtaining of the (i−1)th data value further comprises incrementing of a data register by one when a next data value is not written into the data register.

10. The method of claim 7, wherein obtaining of the (i−1)th data value further comprises incrementing of a data register by two when a next data value is written into the data register.

11. The method of claim 10, wherein the incrementing of the data register by two is performed once in a convolution period.

12. The method of claim 11, wherein the (i−1)th convolution sum is set to zero at an end of the convolution period.

13. A multirate filter, comprising:
   a coefficient calculator, the coefficient calculator calculating a coefficient value and further comprising a coefficient multiplier for multiplying an error signal and an addressed data signal from a data memory device to produce a coefficient product and an addressed coefficient value; and
   a convoluter comprising a convolution multiplier for multiplying the addressed data signal and the addressed coefficient value to obtain a convolution product, and a convolution adder for adding the convolution product to an input to the convolution adder to generate a convolution value.

14. The multirate filter of claim 13, further comprising a coefficient address generator for incrementing a coefficient memory device by M to produce a second addressed coefficient value, wherein M is a predetermined integer value.

15. The multirate filter of claim 14, further comprising a data address generator for incrementing the data memory device by i, wherein i is a member of a set of consecutive integers.

16. The multirate filter of claim 15, wherein i is incremented by one when a second addressed data signal is not written to the data register.

17. The multirate filter of claim 15, wherein i is incremented by two when a second addressed data signal is written to the data register.

18. The multirate filter of claim 17, wherein i is incremented by 2 once in a convolution period.

19. The multirate filter of claim 13, wherein the input to the convolution adder is a previous convolution value.

20. The multirate filter of claim 13, wherein the input to the convolution adder is a zero when an end to a convolution period is determined.

* * * * *